(12) United States Patent
Liu

(10) Patent No.: US 7,696,782 B2
(45) Date of Patent: Apr. 13, 2010

(54) PROGRAMMABLE CORE FOR IMPLEMENTING LOGIC CHANGE

(75) Inventor: Michael Liu, Sunnyvale, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/032,193

(22) Filed: Feb. 15, 2008

(65) Prior Publication Data

US 2009/0206876 A1    Aug. 20, 2009

(51) Int. Cl.
*H03K 19/177* (2006.01)
*H03K 19/173* (2006.01)
(52) U.S. Cl. .......................................... 326/39; 326/38
(58) Field of Classification Search .............. 326/38–41
See application file for complete search history.

(56) References Cited

U.S. PATENT DOCUMENTS

| 6,211,697 | B1 * | 4/2001 | Lien et al. ..................... 326/41 |
| 6,242,945 | B1 * | 6/2001 | New ............................. 326/39 |
| 6,467,074 | B1 | 10/2002 | Katsioulas et al. |
| 6,693,452 | B1 * | 2/2004 | Ansari et al. ................... 326/38 |
| 6,798,239 | B2 * | 9/2004 | Douglass et al. .............. 326/39 |
| 6,922,823 | B2 | 7/2005 | Tester |
| 7,323,905 | B2 | 1/2008 | Madurawe |

OTHER PUBLICATIONS

U.S. Appl. No. 60/659,030, filed Mar. 4, 2005.

* cited by examiner

*Primary Examiner*—Daniel D Chang
(74) *Attorney, Agent, or Firm*—Brake Hughes Bellermann LLP

(57) ABSTRACT

An apparatus comprising a plurality of fixed logic circuits, wherein each of the fixed logic circuits is configured to receive a plurality of input signals, perform combinational logic operations using the input signals, and produce at least one output signal, and wherein the combinational logic operations are substantially fixed; and a programmable logic core configured to functionally replace a selected subset of the plurality of fixed logic circuits, receive the input signals of the selected subset of the plurality of fixed logic circuits, perform logic operations on the input signals, and produce at least one output signal as the output signal of the selected subset of the plurality of fixed logic circuits, and wherein the logic operations are dynamically changeable.

7 Claims, 10 Drawing Sheets

100

200

400

500

FIG. 6 600
602 Wide Network Stage
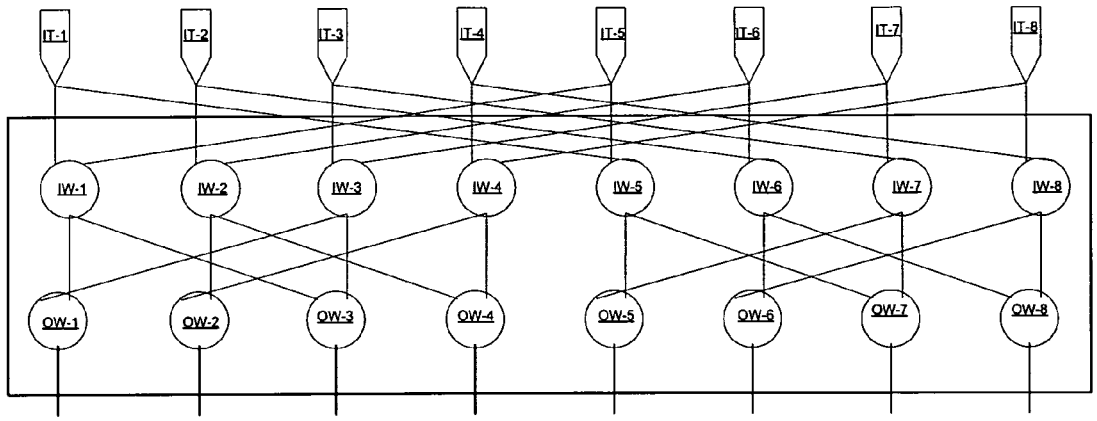
604 Joint Network Stage
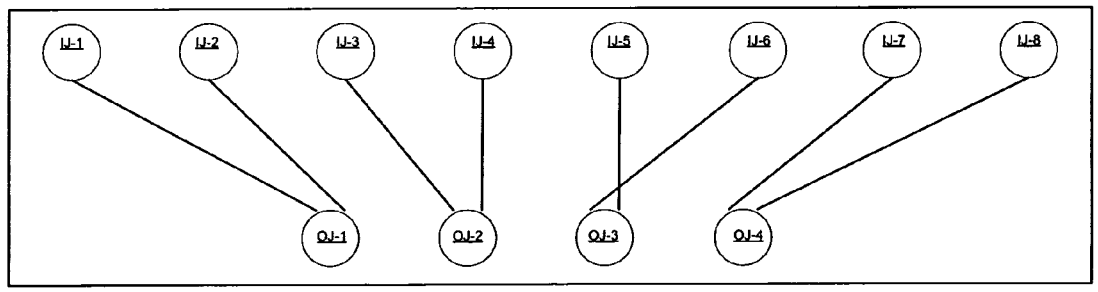
606 Narrow Network Stage
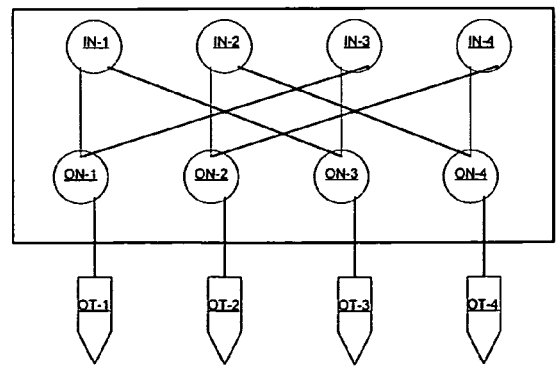

902 Switch Node 2 input, 2 outputs

904 Switch Node - 2 input, 1 outputs

1000

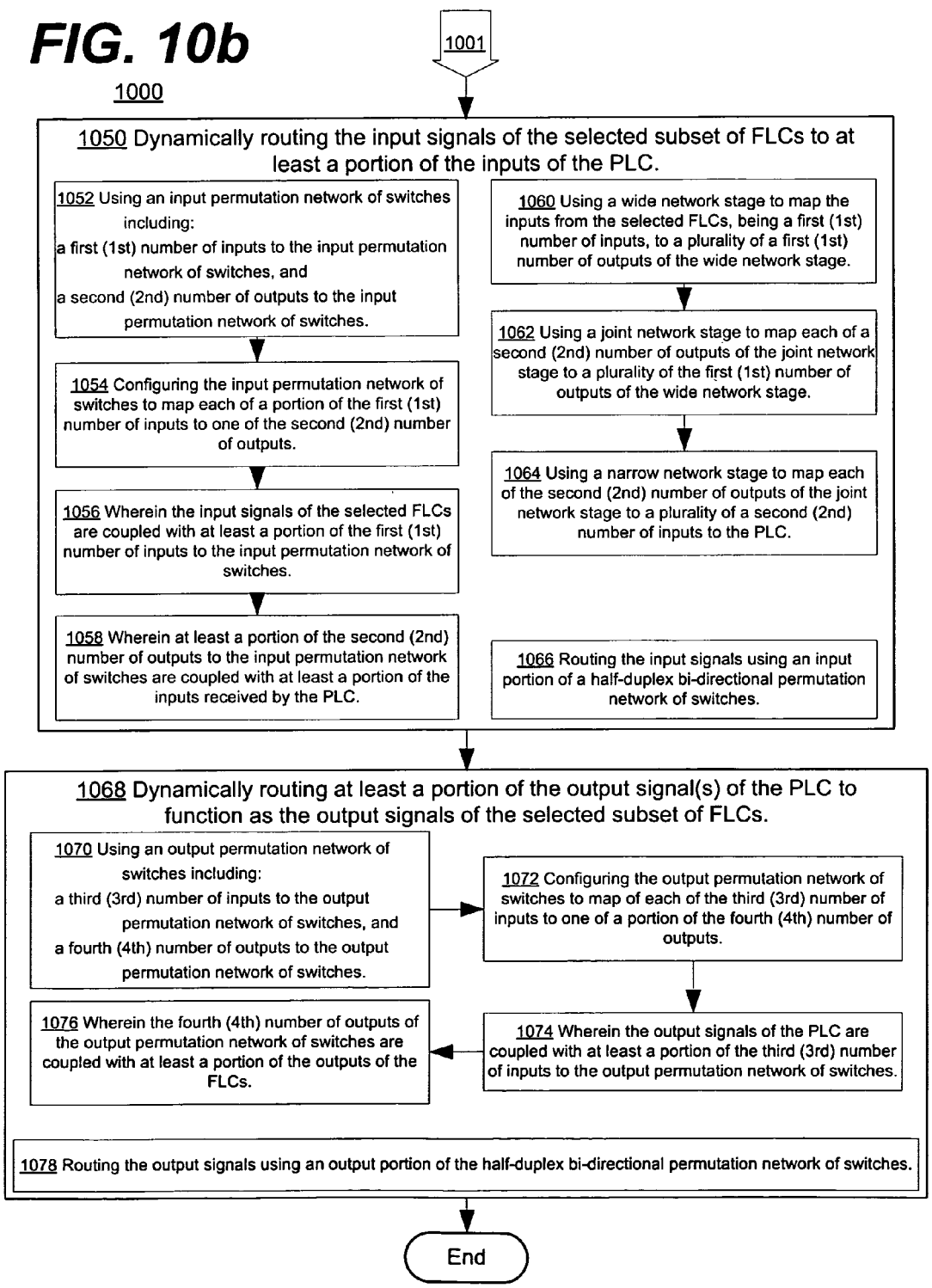

US 7,696,782 B2

PROGRAMMABLE CORE FOR IMPLEMENTING LOGIC CHANGE

TECHNICAL FIELD

This description relates to implementing logic changes or additions to a fixed logic system and more specifically to using a programmable logic core for implementing changes or additions to a fixed logic system.

BACKGROUND

The growing complexity of integrated circuits or microchips has led to a gap between what can be designed and what can be verified in a reasonable amount of time. As a result, there are frequently chips that are designed, manufactured, and then considered unusable. There may be numerous reasons why a chip is deemed unusable or in need of modification, but the most common design faults are: design errors or bugs, performance issues, inoperability and non-compliance to a standard. Often when a chip is deemed unsuitable for use, the chip need only be partially redesigned to correct its design faults. Furthermore, usually only a few logic elements need to be changed to fix the design faults.

Currently when a chip needs modification to fix design faults, designers often have two options. The first option is referred to as a "re-spin". Typically in a re-spin, the entire layout or blueprint for the chip manufacturing is redone or reassembled. The second option is to use unused logic elements that were placed on the chip, called spare-gates, to fix design faults. Often both options require the chip layout to be rebuilt by the manufacturer, but the use of spare-gates or an Engineering Change Order (ECO) is often a more attractive option in terms of cost as only a few metal masks usually need to be rebuilt as opposed to a change of the entire mask set for a re-spin. This usually saves time and money compared to a full re-spin. However, an ECO can handle only a finite number of changes and so the decision may depend on the amount of logic that needs changing.

SUMMARY

A system and/or method for processing information, substantially as shown in and/or described in connection with at least one of the figures, as set forth more completely in the claims.

BRIEF DESCRIPTION OF THE DRAWINGS

FIG. 6 is a block diagram of an example embodiment of an apparatus for routing signals in the aid of implementing logic changes in accordance with the disclosed subject matter.

DETAILED DESCRIPTION

Figure 1:
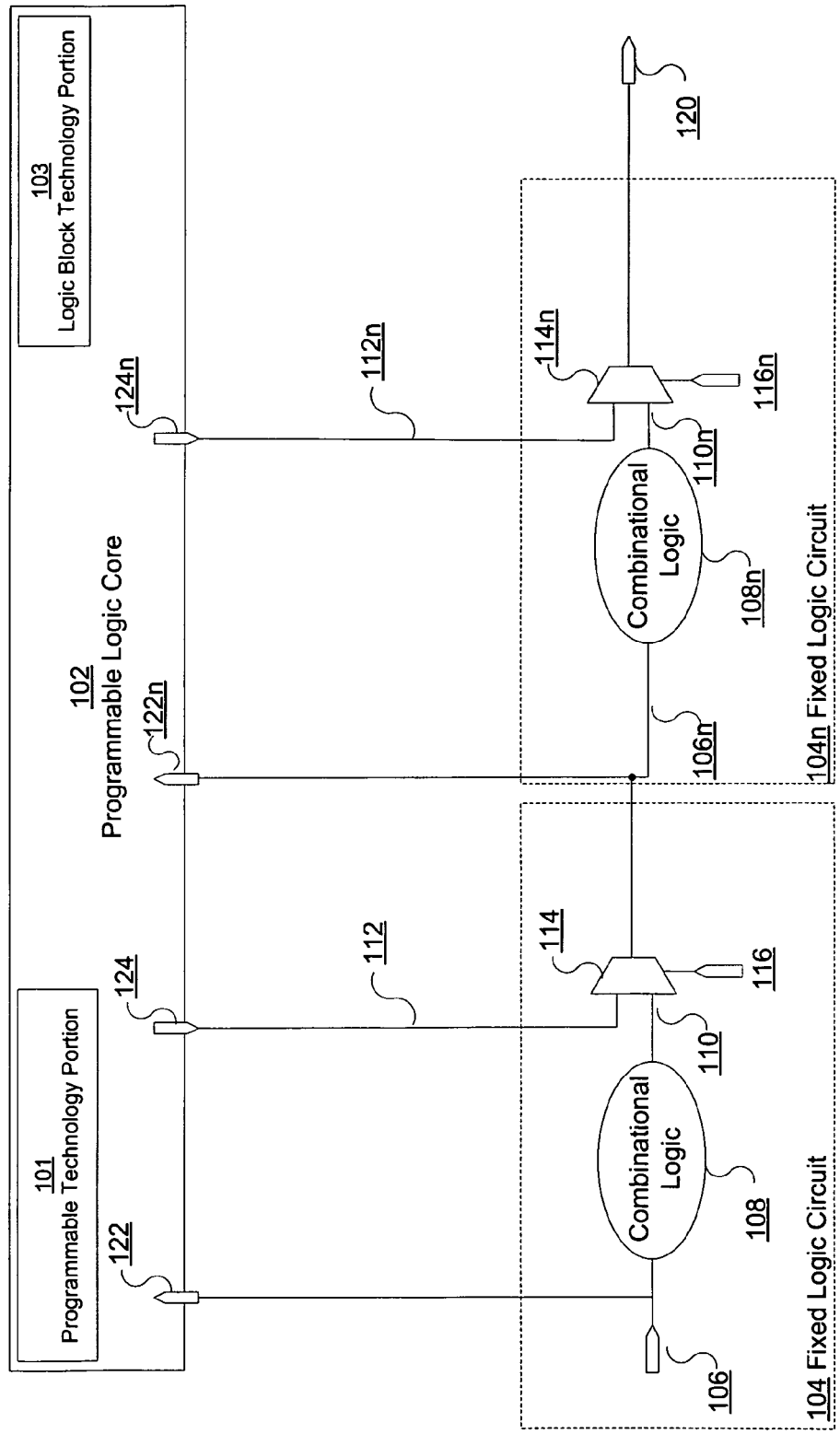
FIG. 1 is a block diagram of an example embodiment of an apparatus for implementing logic changes in accordance with the disclosed subject matter.

FIG. 1 is a block diagram of an example embodiment of an apparatus 100 for implementing logic changes in accordance with the disclosed subject matter. In one embodiment, the apparatus 100 may include a plurality of fixed logic circuits 104 and 104n, and a programmable logic core 102.

In one embodiment, the fixed logic circuit 104 may receive a plurality of input signals 106. In various embodiments, the fixed logic circuit 104 may include at least one combinational logic block 108 to produce an output signal 110 by performing logical operations on the input signals 106. In such an embodiment, the combinational logic block 108 may include various Boolean logic operations (e.g., NAND, NOR, NOT, XOR, etc.), stabilizing logic devices (e.g., flip-flops, latches, etc.), other logic devices, or a combination thereof. These combinational logic operations may be configured in simple or complex fashion to process the input signals 106 to achieve a desired result. It is understood that while a few illustrative examples of synchronous combinational logic operations are described, the disclosed subject matter is not so limited and may include asynchronous operations, or a mixture thereof.

In various embodiments, the combinational logic operations or combinational logic block 108 may be substantially fixed. In one embodiment, the combinational logic operations may comprise a plurality of complementary metal oxide semiconductors (CMOS) transistors. In various embodiments, these CMOS transistors may be arranged into gates that perform the logical operations; although it is understood that other technologies may be used and are within the scope of the disclosed subject matter.

In such an embodiment, the majority of the combinational logic operations may be unchangeable once the integrated circuit or circuit in general has been manufactured. In some embodiments, the combinational logic block 108 may include a number of spare-gates. In such an embodiment, these spare-gates may be unused gates that may be connected via a process similar or analogous to the Engineering Change Order (ECO), as described above. In one embodiment, a change may include effectively "de-soldering" the metal connections between selected used gates, and effectively "re-soldering" a connection with the spare-gates in a desired fashion. In another embodiment, the "soldering" may involve altering a metal mask associated with the manufacture of the fixed logic circuit 104 and producing another chip. Also, various techniques may be used to make minor but non-trivial changes to optical technology embodiments of the fixed logic circuit 104. Therefore, because such alterations may be possible but non-trivial and/or costly, the combinational logic operations 108 or the fixed logic circuit 104 may be described as fixed or substantially fixed. Although, it is understood that the above are merely a few illustrative examples to which the disclosed subject matter is not limited.

In some embodiments, the fixed logic circuit 104 may include errors or otherwise undesirable combinational logic operations. In various embodiments, it may be desirable to ameliorate or fix these errors or undesirable operations. In one embodiment, the apparatus 100 may include a programmable logic core 102. In such an embodiment, the programmable logic core 102 may be configured to receive a plurality of input signals (e.g., input signals 106 and 106n via input ports 122 and 122n), perform logic operations on the input signals, and produce at least one output signal (e.g., output signals 112 and 112n via output ports 124 and 124n). Furthermore, in one embodiment, the programmable logic core 102 may include logic operations that, unlike the fixed logic circuits 104, are dynamically configurable.

In various embodiments, the programmable logic core 102 may include one or more of a plurality of programmable logic technologies. Various embodiments of programmable logic cores 102 may include slightly different architecture and programming technology, and thus each may have various respective strengths and weaknesses. It is understood that the programmable logic core 102 depicted in the disclosed subject matter may be implemented using any programmable logic technologies.

In some embodiments, the programmable logic core 102 may include a programming technology portion 101 and a logic block technology portion 103. In one embodiment, the programmable technology portion 101 may include programming technology such as, for example, static random access memory (SRAM), electronically erasable programmable read-only-memory (EEPROM), Anti-fuse, Via™ based technologies, etc. These technologies may offer, in one embodiment, relatively easy configuration and re-configurability when placed in an integrated circuit (IC). In addition, in some embodiments (e.g., SRAM), circuits may use a standard CMOS process and therefore can be easily incorporated into the IC design and fabrication flow.

In one embodiment, the logic block technology portion 103 may be implemented using, for example, a product term based architecture (e.g., an Altera™ field-programmable gate arrays (FPGA)), a look-up table architecture (e.g., a Xilinx™ FPGA), or another technology. The programmable logic core 102 may be configured to implement various logic function(s) using the given inputs. In a specific illustrative embodiment, an SRAM programming technology portion 101 may be configured to use a look-up table (LUT) based logic block technology portion 103. Although, it is understood that the above are merely a few illustrative examples to which the disclosed subject matter is not limited.

As described above, in one embodiment, the programmable logic core 102 may receive input signals 122 and 122n, perform the configured logic operations on the received signals, and produce output signals 112 and 112n. In some embodiments, the fixed logic circuit 104 may receive the output signal 112 from the programmable logic core 102. In various embodiments, the fixed logic circuit 104 may be configured to select between the output signal 110 produced by the combinational logic 108 and the output signal 112 produced by the programmable logic core 102. In such an embodiment, a selected fixed logic circuit 104 may be functionally replaced by a portion of the programmable logic core 102, as described in more detail below.

In one embodiment, the fixed logic circuit 104 may include a selection device, such as for example a multiplexer 114 to select between the output signal 110 produced by the combinational logic 108 and the output signal 112 produced by the programmable logic core 102. In such an embodiment, a control signal 116 may be used to select between the two output signals. In another embodiment, an equivalent selection may occur in fixed logic circuit 104n using selection device 114n and control signal 116n.

In yet another embodiment, the input signals 106 from fixed logic circuit 104 may be received by the programmable logic core 102 and processed to create output signal 112n. In such an embodiment, both fixed logic circuits 104 and 104n may be functionally replaced. In other embodiments, a plurality of fixed logic circuits may be functionally replaced. In some embodiments, all or a portion of the input signals from the replaced fixed logic circuits may be input to the programmable logic core 102, depending upon the needs of the configured logic.

Figure 2:
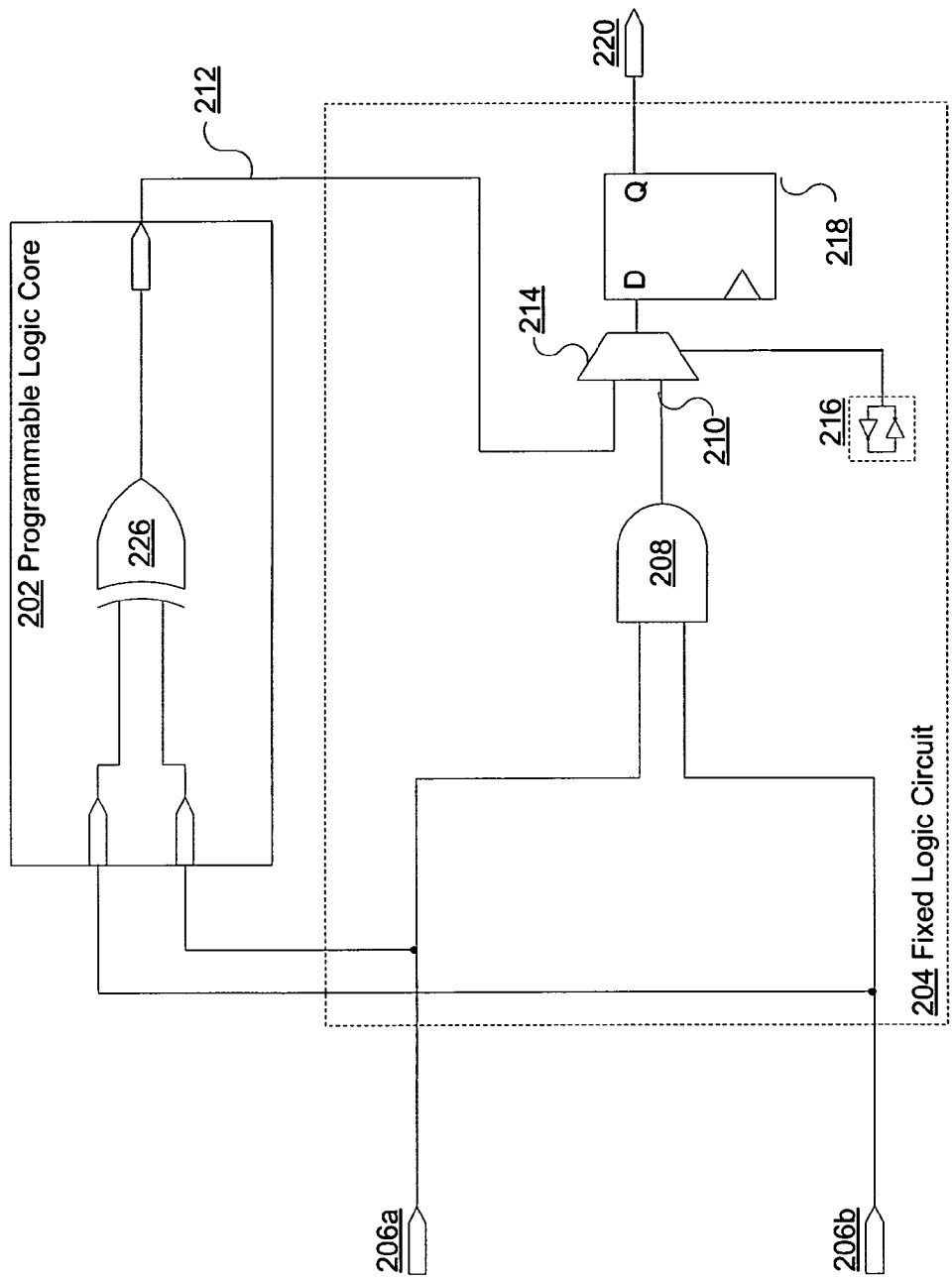
FIG. 2 is a block diagram of an example embodiment of an apparatus for implementing logic changes in accordance with the disclosed subject matter.

FIG. 2 is a block diagram of an example embodiment of an apparatus 200 for implementing logic changes in accordance with the disclosed subject matter. In one embodiment, the apparatus 200 may include a fixed logic circuit 204, and a programmable logic core 202. Apparatus 200 includes a specific illustrative embodiment showing how the combinational logic operation(s) 208 of the fixed logic circuit 204 may be functionally replaced by a portion 226 of the programmable logic core 202.

In one embodiment, the input signals 206a and 206b may be input to both the fixed logic circuit 204 and the programmable logic core 202. Within the fixed logic circuit 204, the input signals 206a and 206b may be processed by combinational logic operation(s) 208 to produce the output signal 210. In the illustrated embodiment, the combinational logic operation may be a Boolean AND. In one embodiment, the output signal 210 may then be stabilized using a flip-flop 218 before being ultimately output via signal 220. In various embodiments, this output signal 220 may be an input signal to another fixed logic circuit.

In the specific illustrative embodiment, after the manufacture of the apparatus 200, it may be noticed that the combinational logic operation 208 of the fixed logic circuit 204 is not correct, in error, or otherwise undesirable. In such an embodiment, the programmable logic core, or a portion thereof, may be dynamically configured to provide an alternative logic operation to that of the fixed logic circuit 204. In the illustrated embodiment, the programmable logic core 202 may be configured to perform an XOR logic operation 226 on the input signals 206a and 206b, and output the output signal 212.

In one embodiment, the fixed logic circuit 204 may be configured to route the output signal 212 of the programmable logic core 202 as the output of the fixed logic circuit 204. In various embodiments, the dynamic routing may occur using a multiplexer 214 to select between the output signal 210 of the combinational logic operation 208 (e.g., the AND gate) or the output signal 212 of the programmable logic operation 226 (e.g., the XOR gate). In the illustrated embodiment, a control signal 216 may be used to determine whether or not the output signal 212 is dynamically routed or selected as the output of the fixed logic circuit 204. In some embodiments, the control signal 216 may be produced using a programmable switch (not shown). By selecting between the two output signals the fixed logic circuit 204 may be functionally replaced by the configured portion of the programmable logic core 202.

Such a replacement may allow the error or otherwise undesirable result produced by the combinational logic operations 208 to be changed and/or repaired. In one embodiment, the programmable logic core 202 may allow designers to test various proposed logic operations before determining the desired logic operation to use. For example in the illustrative embodiment, the programmable logic core 202 may be programmed to perform the XOR operation. However, if that result too is deemed to be undesirable the programmable logic core 202 may be re-programmed to perform another operation (e.g., NOR). If that too is deemed undesirable the programmable logic core 202 may be re-programmed again to perform yet another operation (e.g., NAND). This process may continue until a desired logic operation is found. Furthermore, in yet another embodiment, more fixed logic circuits (not shown) may be functionally replaced by the programmable logic core 202 if needed or desired. In one embodiment, once a desired logic operation has been determined, the fixed logic circuit 204 may be altered to reflect the desired logic operation in a subsequent manufacture of the apparatus 200 (e.g., a "re-spin" of the apparatus 200 or an integrated circuit comprising the apparatus 200).

Figure 3:
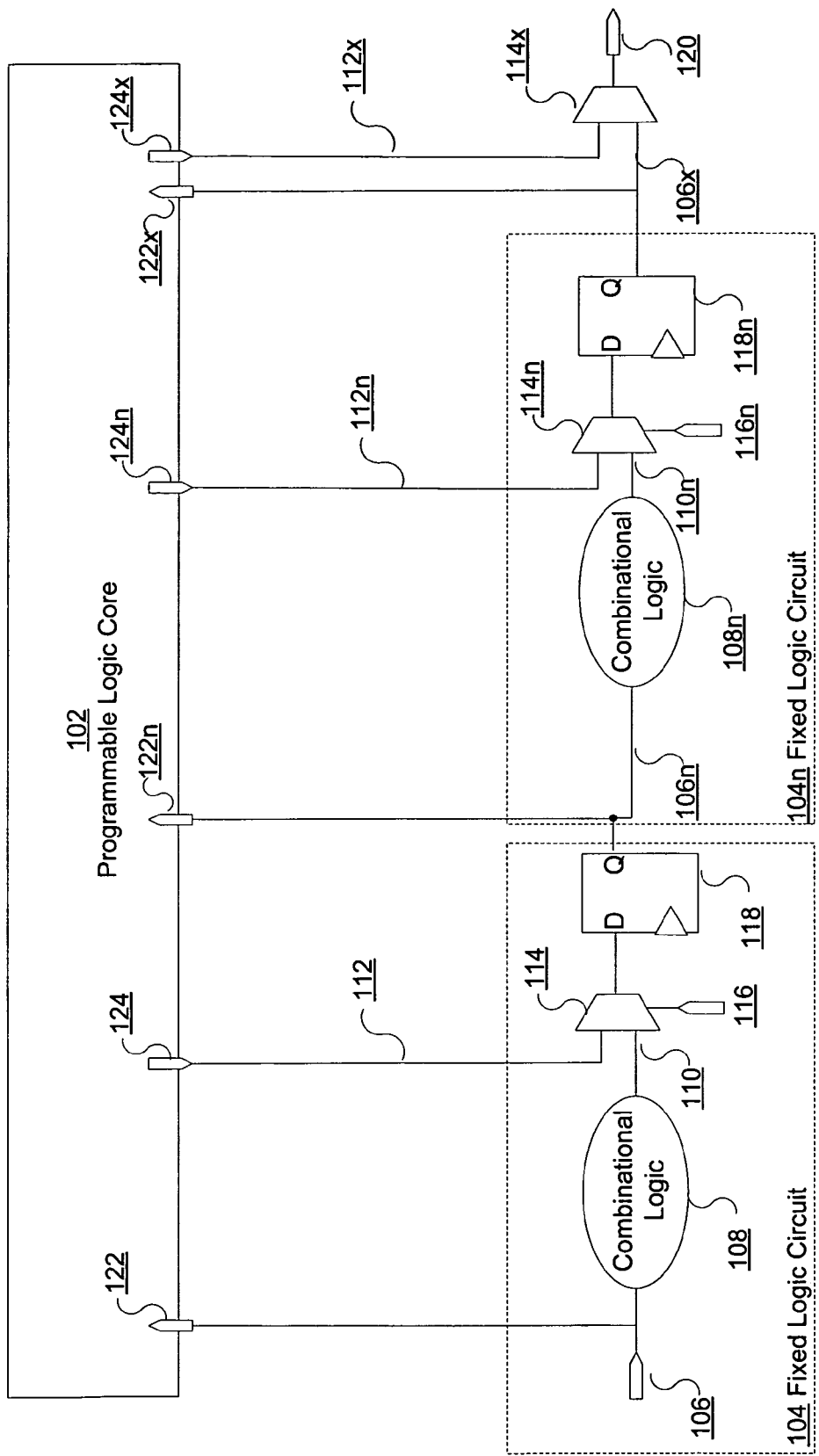
FIG. 3 is a block diagram of an example embodiment of an apparatus for implementing logic changes in accordance with the disclosed subject matter.

FIG. 3 is a block diagram of an example embodiment of an apparatus 300 for implementing logic changes in accordance with the disclosed subject matter. In one embodiment, the apparatus 300 may include a plurality of fixed logic circuits 104 and 104n and the programmable logic core 102, as described above in reference to FIG. 1.

However, apparatus 300 may also illustrate that the plurality of fixed logic circuits 104 may include stages in a processing pipeline. In various embodiments, a processing pipeline may include a sequence of stages a computer or processing device uses to process data or carry out instructions. In some embodiments, the processing of data may take multiple computer clock cycles. By breaking the processing down into a plurality of smaller steps processing on a subsequent piece of data may be started before the processing of the prior piece of data is fully completed. Frequently, as a stage of a pipeline finishes manipulating data, it hands the results to the next stage and gets another piece of data from the stage before it, moving several pieces of data along the pipeline simultaneously. Visually, one might think of the classic Ford Model-T assembly line as analogous to a pipelined IC architecture. In various embodiments, a device may include multiple pipelines or pipelines that allow for branching.

In one embodiment, the programmable logic core 102 may be configured to functionally replace a fixed logic circuit 104 and therefore a stage of the processing pipeline, as described above. In such an embodiment, the programmable logic core 102 may use the input signals 106 of one stage 104 and provide input signals 106n (output signals from the programmable logic core's point of view) to the subsequent stage 104n.

In another embodiment, the programmable logic core 102 may be configured to provide additional pipe-stages or functionality. In such an embodiment, the programmable logic core 102 may be configured to receive input signals 106x via input terminal 122x that are the output signals 106x of the last or a given stage 104n in the pipeline. The programmable logic core 102 may be configured to perform logic operations on the input signals 106x and produce at least one output signal 112x via output terminal 124x. In one embodiment, a selection device 114x may be configured to select whether the output signal 112x of the programmable logic core 102 or the output signal 106x of the fixed logic circuit 104n is to be output signal 120.

In such an embodiment, the programmable logic core 102 may be configured to include at least one additional stage in the processing pipeline that is dynamically configurable. It is understood that such an additional stage may be added in between two or more existing pipe-stages. Furthermore, it is understood that while such a stage may, in one embodiment, be added for testing purposes, in another embodiment, the additional stage may be used to add additional features not desired or contemplated when the apparatus 300 was manufactured.

In one embodiment, the plurality of fixed logic circuits (e.g., fixed logic circuits 104 and 104n) may include stabilizing logic devices (e.g., flip-flops 118 and 118n). In one illustrative embodiment, these stabilizing logic devices may allow each pipe-stage to use a differing amount of time to process their respective input signals while conforming to an overall timing requirement; although it is understood that the above is merely one illustrative example to which the disclosed subject matter is not limited. In various embodiments, these stabilizing logic devices may include devices such as flip-flops, latches, etc. In one embodiment, the input signals (e.g., input signals 106, 106n, and 106x) may be the output of a stabilizing logic device (e.g., flip-flops 118 and 118n).

Figure 4:
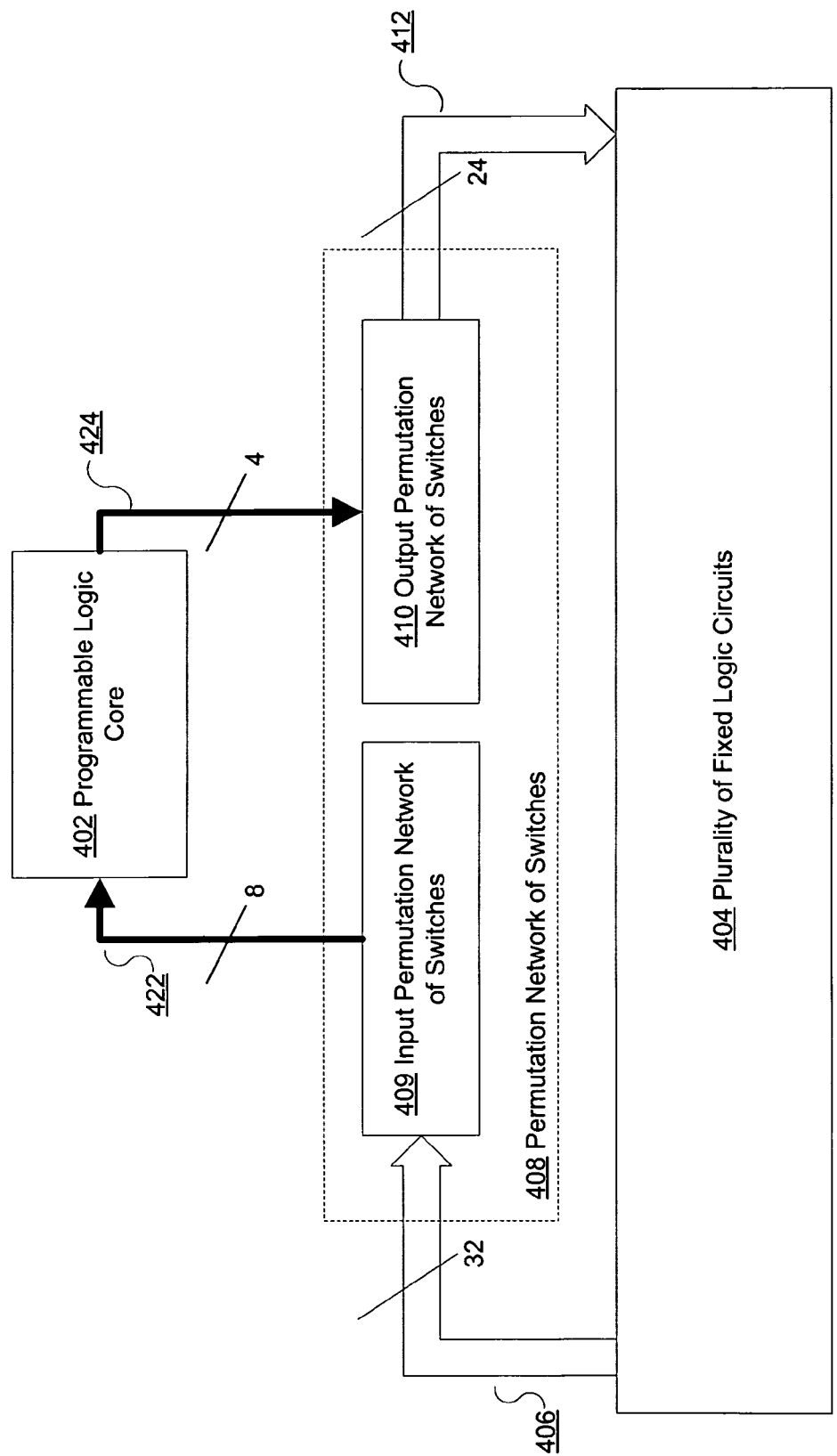
FIG. 4 is a block diagram of an example embodiment of a system for implementing logic changes in accordance with the disclosed subject matter.

FIG. 4 is a block diagram of an example embodiment of a system 400 for implementing logic changes in accordance with the disclosed subject matter. In one embodiment, the system 400 may include a programmable logic core 402, a plurality of fixed logic circuits 404, and a permutation network of switches 408. In various embodiments, the system 400 may include or be included as part of a microchip, integrated circuit, or processor. In some embodiments, the plurality of fixed logic circuits 404 may be configured to provide superior speed and power usage compared to the programmable logic core 402. In some embodiments, the fixed logic circuits 404 may be optimized due to being synthesized from written source code, or, in another embodiment, laid out manually to perform the specific logic operations. Whereas, the programmable logic core 402 may be more generic and therefore less optimized.

In one embodiment, the plurality of fixed logic circuits 404 may include a number of input signals that may be selected as the input signals to the programmable logic core 402. In various embodiments, the plurality of fixed logic circuits 404 may include far more input signals than can be or are desirable to be input into the programmable logic core 402. In such an embodiment, the total number of possible input signals may be considered to be relatively very large. From that relatively very large number of total input signals to the fixed logic circuits 404, a relatively small number of the possible input signals may be selected to be input into the programmable logic core 402. In another embodiment, it may be desirable to make a relatively medium number of input signals available to the programmable logic core 402, and then dynamically select a fewer (relatively small) number to actually be routed as inputs to the programmable logic core 402. As such, a subset of the fixed logic circuits 404 may be selected to be replaced or used by the programmable logic core 402.

In such an embodiment, the permutation network of switches 408 may be configured to dynamically route a selected subset of the relatively large number of input signals of the plurality of fixed logic circuits 404 to a relatively smaller number of the inputs signals of the programmable logic core 402. In various embodiments, the permutation network of switches 408 may include an input permutation network of switches 409 configured to perform this dynamic routing. In one embodiment, the relatively large number (e.g., 32) of input signals 406 may be routed from the plurality of fixed logic cores 404 to the permutation network of switches 408.

In one embodiment, the permutation network of switches 408 may be configured to dynamically map a selected subset of the relatively large number of input signals 406 from the plurality of fixed logic circuits 404 to the relatively smaller number (e.g., 8) of input signals 422 to the programmable logic core 402. It is understood that in various embodiments, not all of the input signals 422 to the programmable logic core 402 may be used, and therefore, in some of these embodiments the permutation network of switches 408 may be configured to map the unused portion of the input signals 422 to a fixed or known value (e.g., "high", "low", etc.).

Likewise, in one embodiment, the plurality of fixed logic circuits 404 may include a number of output signals that may be selected to receive or be mapped to the output signals to the programmable logic core 402. In various embodiments, the plurality of fixed logic circuits 404 may include more output signals than can be or are desirable to be produced by the programmable logic core 402. In some embodiments in which the fixed logic circuits 404 include an output signal selection device, the concern may be the amount of routing needed between the programmable logic core 402 and the fixed logic circuits 404; although, it is understood that the above is merely an illustrative example to which the disclosed subject matter is not limited. In such an embodiment, a number of the possible output signals may be selected to be output from the programmable logic core 402. In another embodiment, it may be desirable to make a medium number of output signals available to the programmable logic core 402, and then select a fewer number to actually be routed as outputs from the programmable logic core 402. As such, a subset of the fixed logic circuits 404 may be selected to be replaced or used by the programmable logic core 402.

In such an embodiment, the permutation network of switches 408 may be configured to dynamically route a portion of the output signals of the programmable logic core 402 to a selected subset of the output signals of the plurality of fixed logic circuits 404. In various embodiments, the permutation network of switches 408 may include an output permutation network of switches 410 configured to perform this dynamic routing.

In one embodiment, a relatively small number (e.g., 4) of output signals 424 from the programmable logic core 402 may be routed to the permutation network of switches 408. In one embodiment, the permutation network of switches 408 may be configured to map a relatively small number (e.g., 4) of output signals 424 from the programmable logic core 402 to a selected subset of the relatively large number (e.g., 24) of output signals 412 of the plurality of fixed logic circuits 404. It is understood that in various embodiments, not all of the output signals 412 to the plurality of fixed logic circuits 404 may be used, and therefore, in some of these embodiments the permutation network of switches 408 may be configured to map the unused portion of the output signals 412 to a fixed or known value (e.g., "high", "low", etc.).

Figure 5:
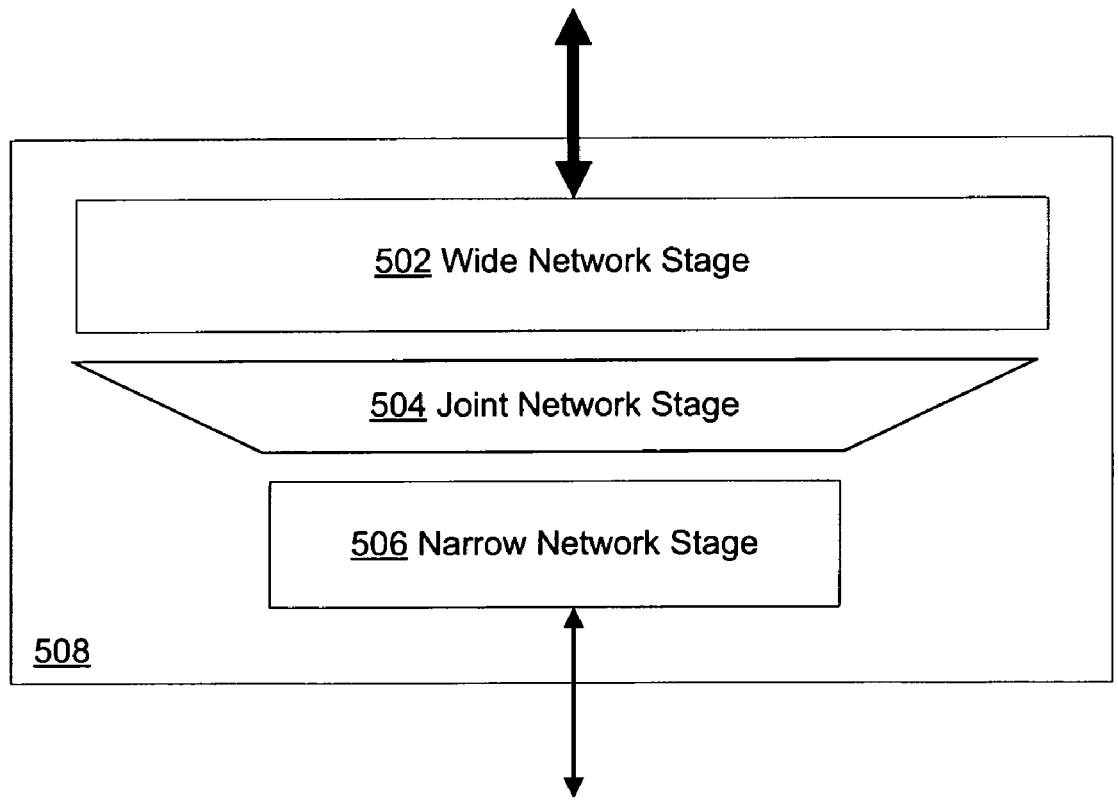
FIG. 5 is a block diagram of an example embodiment of an apparatus for routing signals in the aid of implementing logic changes in accordance with the disclosed subject matter.

FIG. 5 is a block diagram of an example embodiment of an apparatus 500 for routing signals in the aid of implementing logic changes in accordance with the disclosed subject matter. In one embodiment, the permutation network of switches 508 may include a three-stage network of switches. In such an embodiment, the permutation network of switches 508 may include a wide network stage 502, a joint network stage 504, and a narrow network stage 506. These stages may be configured to map a relatively large number (M) of inputs to a relatively small number (N) of outputs, or vice versa.

FIG. 6 is a block diagram of an example embodiment of an apparatus 600 for routing signals in the aid of implementing logic changes in accordance with the disclosed subject matter. In one embodiment, the permutation network of switches 600 may include a wide network stage 602, a joint network stage 604, and a narrow network stage 606. FIG. 6 illustrates an embodiment in which 8 inputs may be mapped to 4 outputs forming an 8-by-4 permutation network of switches. However, other embodiments may include an M-by-N permutation network of switches configured to map a relatively large number (M) of inputs to a relatively small number (N) of outputs. Also, the terms "inputs" and "outputs" may be relative such that an M-by-N permutation network of switches may be reversed and configured to operate as an N-by-M permutation network of switches. It is understood that the above are merely a few illustrative examples to which the disclosed subject matter is not limited.

In one embodiment, the permutation network of switches 600 may be configured to map each of a portion of the relatively large number (M) of inputs to one of a relatively small number (N) of outputs. In one embodiment, the wide network stage 602 may include a relatively large number (M) of inputs (e.g., input terminals IT-1, IT-2, IT-3, IT-4, IT-5, IT-6, IT-7, and IT-8), a relatively large number (M) of intermediate nodes (e.g., intermediate nodes IW-1, IW-2, IW-3, IW-4, IW-5, IW-6, IW-7, and IW-8), and a relatively large number (M) of outputs (e.g., output nodes OW-1, OW-2, OW-3, OW-4, OW-5, OW-6, OW-7, and OW-8). In some embodiments, each node may be a switch or switch node. In one embodiment, the wide network stage 602 may be configured to map each of a relatively large number (M) of inputs to a plurality of the relatively large number (M) of outputs.

In various embodiments, a wide network stage 602 implemented as a butterfly network may use $\log_2(N)$ levels to ultimately map one of the M inputs to N of the outputs of the narrow network stage 606 of the permutation network of switches 600. In the illustrated embodiment shown in FIG. 6, N equals 4, so the wide network stage 602 is built using $\log_2(4)$ or two stages of the butterfly network. The nomenclature possibly used to describe the wide network may be M×M–L, where M equals the number of inputs and outputs to the wide network stage 602, and L represents the number of levels. In the illustrated embodiment shown in FIG. 6, the wide network stage 602 includes an 8×8–2 network.

In the illustrative embodiment, the first input terminal IT-1 may be mapped to both the first and fifth intermediate nodes IW-1 and IW-5. Likewise, in this embodiment, the first intermediate node IW-1 may be mapped to both the first and third output nodes OW-1 and OW-3, and the fifth intermediate node IW-5 may be mapped to both the fifth and seventh output nodes OW-5 and OW-7. Therefore, in this embodiment, the wide network stage 602 may be configured to map first intermediate terminal IT-1 to four output nodes OW-1, OW-3, OW-5, and OW-7, or conversely from the four output nodes to the input terminal. A similar mapping may be seen for the other input terminals and output nodes. It is understood that the above are merely a few illustrative examples to which the disclosed subject matter is not limited.

In one embodiment, the joint network stage 604 may include a relatively large number (M) of inputs (e.g., input nodes IJ-1, IJ-2, IJ-3, IJ-4, IJ-5, IJ-6, IJ-7, and IJ-8), and a relatively small number (N) of outputs (e.g., output nodes OJ-1, OJ-2, OJ-3, and OJ-4). In one embodiment, the joint network stage 604 may be configured to map each of a relatively small number (N) of outputs to a plurality of the relatively large number (M) of inputs. Using the nomenclature described above, the joint network stage 604 may be referred to as an 8×4–1 network.

In the illustrative embodiment, the first and second inputs IJ-1 and IJ-2 may both be mapped to the first output OJ-1. Likewise, in this embodiment, each of the outputs may be mapped to two of the inputs. A similar mapping may be seen for the other input terminals and output nodes. To continue the mapping of the first input terminal IT-1, the four input nodes IJ-1, IJ-3, IJ-5, and IJ-7 may be mapped to all four of the output nodes OJ-1, OJ-2, OJ-3, and OJ-4. It is understood that the above are merely a few illustrative examples to which the disclosed subject matter is not limited.

In one embodiment, the narrow network stage 606 may include a relatively small number (N) of inputs (e.g., input nodes IN-1, IN-2, IN-3, and IN-4), a relatively small number (N) of outputs (e.g., output nodes ON-1, ON-2, ON-3, and ON-4), and relatively small number (N) of output terminals (e.g., output terminals OT-1, OT-2, OT-3, and OT-4). In one embodiment, the narrow network stage 606 may be configured to map each of a relatively small number (N) of inputs to a plurality of the relatively small number (N) of outputs.

In various embodiments, the narrow network stage 606 may connect the joint network stage 604 to the final relatively small (N) number of outputs of the permutation network of switches 600. In another embodiment, the narrow network stage 606 may be implemented based upon the topology of the wide network stage 602. In such an embodiment, if the wide network stage 602 is built using an L level of switches then the narrow network stage 606 may have one less (L−1) levels of switches. Each level in the wide network stage 602 may add one level of congestion and it may be desirable, in one embodiment, that the narrow network stage 606 have the same number of levels minus one to facilitate any bit permutation.

In such an embodiment, the topology of the narrow network stage 606 may include a reverse or inverse butterfly implementation. In various embodiments, the narrow network stage 606 may be built using a reverse or inverse butterfly topology when the corresponding wide network stage 602 is built using a butterfly network. This reverse topology may, in one embodiment, remove possible blocking paths. The nomenclature for this network may be N×N−L, where N is the number of inputs and outputs to the narrow network stage 606, and L is the number of levels. The narrow network stage 606 may then be a 4×4−1 narrow network.

In the illustrative embodiment, the first input IN-1 may be mapped to both the first and third outputs ON-1 and ON-3. Each of the output nodes may be or may be mapped to an output terminal. Likewise, in this embodiment, each of the inputs may be mapped to two of the outputs. To continue the mapping of the first input terminal IT-1, the four input nodes IN-1, IN-2, IN-3, and IN-4 may be mapped to all four of the output nodes ON-1, ON-2, ON-3, and ON-4. A similar mapping may be seen for the other input terminals and output nodes. It is understood that the above are merely a few illustrative examples to which the disclosed subject matter is not limited.

In the illustrative embodiment, the three stages may be cascaded. In such an embodiment, a signal coupled with an input terminal of the permutation network of switches 600 may be mapped to one of the output terminals of the permutation network of switches 600. For example, the first input terminal IT-1 may be mapped to any of the output terminals, as described above. Likewise, each of the output terminals may be mapped to one or more of the input terminals. It is understood that the above are merely a few illustrative examples to which the disclosed subject matter is not limited.

Figure 7:
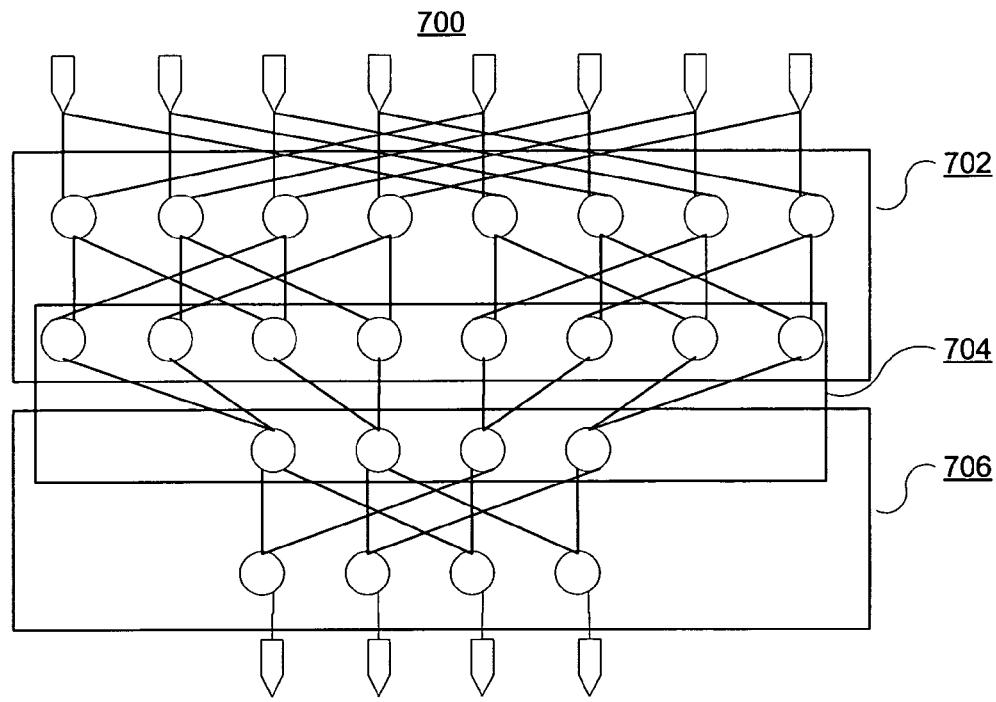
FIG. 7 is a block diagram of an example embodiment of an apparatus for routing signals in the aid of implementing logic changes in accordance with the disclosed subject matter.

FIG. 7 is a block diagram of an example embodiment of an apparatus 700 for routing signals in the aid of implementing logic changes in accordance with the disclosed subject matter. In one embodiment, the permutation network of switches 700 may include a wide network stage 702, a joint network stage 704, and a narrow network stage 706. In various embodiments, the stages may overlap. In one embodiment, the outputs of the wide network stage 702 may be the inputs of the joint network stage 704. In some embodiments, the outputs of the joint network stage 704 may be the inputs of the narrow network stage 706. In such an embodiment, the permutation network of switches 700 may comprise 24 switch nodes arranged in five levels or layers: 1 for the input terminals, 2 for the wide network stage 702, 1 for the joint network stage 704, and 1 for the narrow network stage 706. In various embodiments, each switch nodes may comprise two switches. Therefore, the entire permutation network of switches 700 may total 48 switches, as described below. In such an embodiment, the permutation network of switches 700 may include 29% less switches than a comparable cross-bar switch. It is understood that the above are merely a few illustrative examples to which the disclosed subject matter is not limited.

Figure 8:
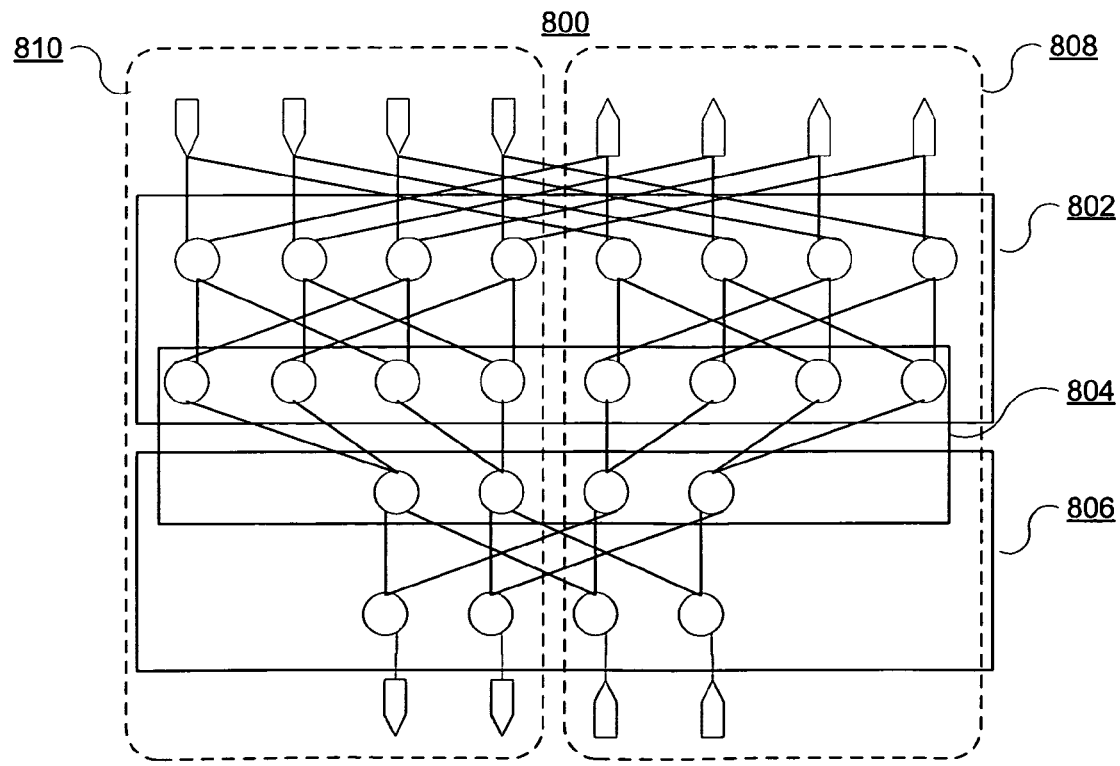
FIG. 8 is a block diagram of an example embodiment of an apparatus for routing signals in the aid of implementing logic changes in accordance with the disclosed subject matter.

FIG. 8 is a block diagram of an example embodiment of an apparatus 800 for routing signals in the aid of implementing logic changes in accordance with the disclosed subject matter. In one embodiment, the permutation network of switches 800 may include a wide network stage 802, a joint network stage 804, and a narrow network stage 806. In one embodiment, the permutation network of switches 800 may include a half-duplex bi-directional permutation network of switches. In such an embodiment, a first portion 810 of the permutation network of switches may be configured to map a relatively large number of inputs to a relatively small number of outputs. In another embodiment, an input permutation of network switches (e.g., input permutation of network switches 409 of FIG. 4) may include the first portion 810 of the half-duplex bi-directional permutation network of switches 800. In such an embodiment, a second portion 808 of the permutation network of switches may be configured to map a relatively small number of inputs to a relatively large number of outputs. In another embodiment, an output permutation of network switches (e.g., output permutation of network switches 410 of FIG. 4) may include the second portion 808 of the half-duplex bi-directional permutation network of switches 800. It is understood that the above is merely an illustrative example to which the disclosed subject matter is not limited.

Figure 9A:
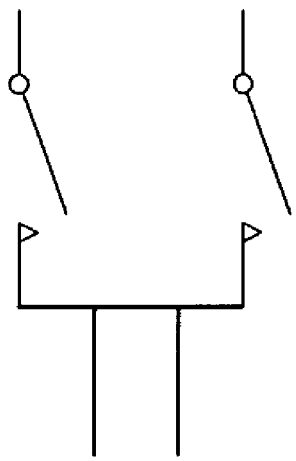
FIG. 9 is a circuit diagram of an example embodiment of apparatus in accordance with the disclosed subject matter.
Figure 9B:
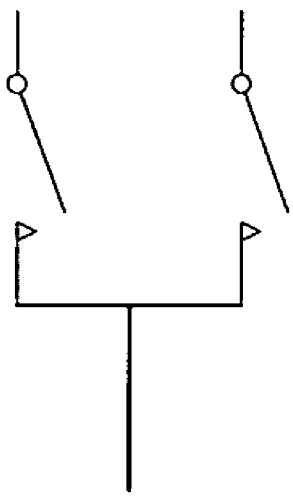

FIG. 9a is a circuit diagram of an example embodiment of apparatus 902 in accordance with the disclosed subject matter. Switch 902 may include a two input to two output switch. In various embodiments, switch nodes such as, for example, the input node IW-1 of FIG. 6 may include switch 902. FIG. 9b is a circuit diagram of an example embodiment of apparatus 904 in accordance with the disclosed subject matter. Switch 904 may include a two input to one output switch. In various embodiments, switch nodes such as, for example, the output node OW-1 of FIG. 6 may include switch 904. It is understood that the above are merely a few illustrative examples to which the disclosed subject matter is not limited. For example, in one embodiment, including a higher order permutation network of switches a many-to-many, many-to-fewer, or many-to-one switch may be used. In some embodiments, a multiplexer may be used. Furthermore, it is understood that in various embodiments the switches may be bi-directional and that the terms "input" and "output" may be relative.

Figure 10A:
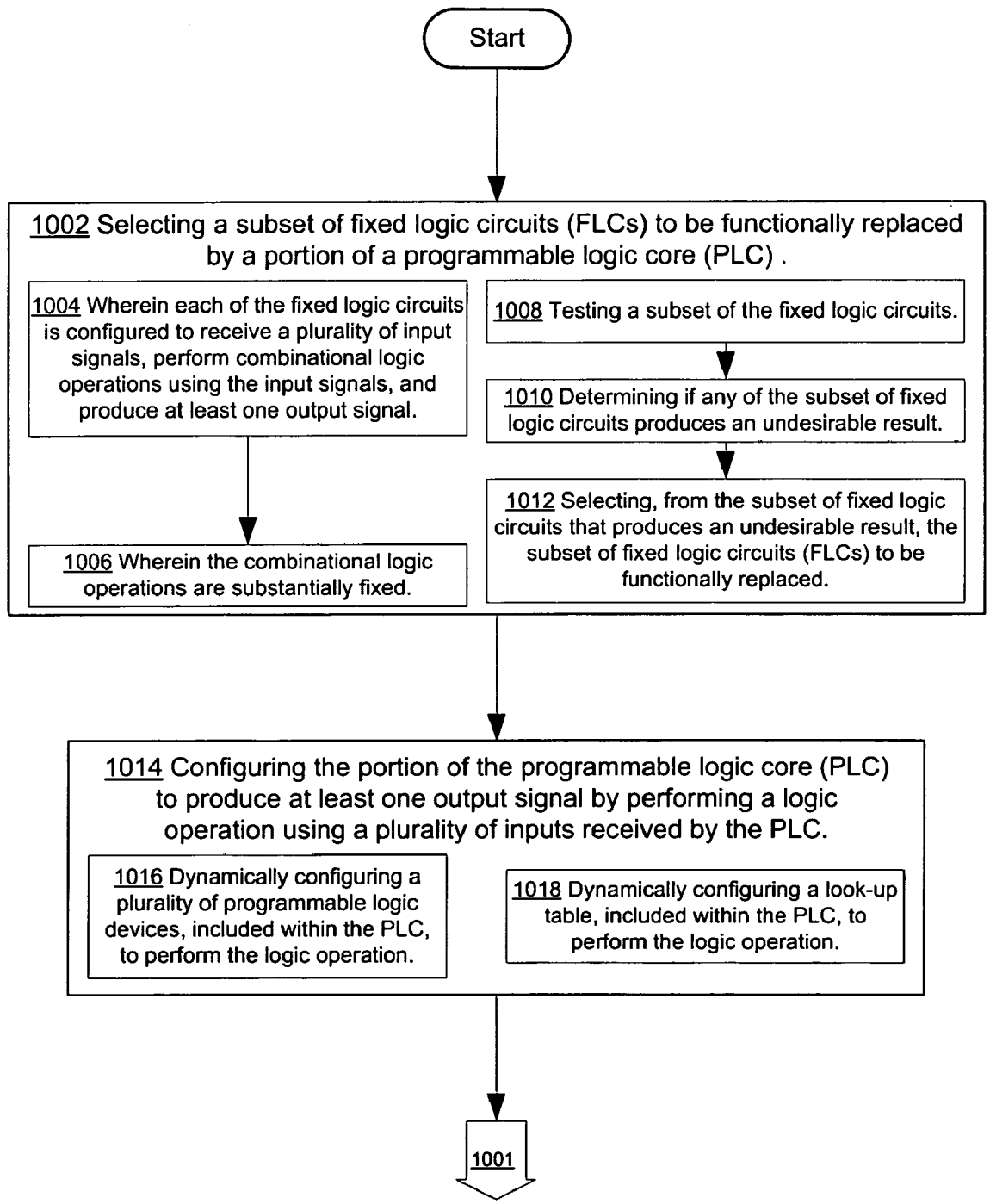
FIG. 10 is a flowchart of an example embodiment of a technique for implementing logic changes in accordance with the disclosed subject matter.

FIG. 10 is a flowchart of an example embodiment of a technique 1000 for implementing logic changes in accordance with the disclosed subject matter. It is understood that FIGS. 10a and 10b represent a single flowchart illustrated on two pages. The connector 1001 provides a way to represent the connection between the two pages. Hereafter and herebefore, the flowchart of the technique 1000 is simply referred to as FIG. 10, as if the flowchart merely occupied a single page.

Block 1002 illustrates that, in one embodiment, a subset of fixed logic circuits (FLCs) may be selected to be functionally replaced by a portion of a programmable logic core (PLC). In various embodiments, the subset of FLCs may be selected because the selected FLCs produce incorrect, otherwise undesirable results; although, it is understood that other selection criteria may be used and are within the scope of the disclosed subject matter. In some embodiments, a subset of the plurality of fixed logic circuits 404 of FIG. 4 may be selected, as described above. In some embodiments, the programmable logic core 402 of FIG. 4 may replace the selected FLCs, as described above.

Block 1004 illustrates that, in one embodiment, each of the fixed logic circuits may be configured to receive a plurality of input signals, perform combinational logic operations using the input signals, and produce at least one output signal. Block 1006 illustrates that, in one embodiment, the combinational logic operations of each fixed logic circuit may be substantially fixed, as described above. In some embodiments, the plurality of fixed logic circuits 104 of FIG. 1 may be configured as described above.

Block 1008 illustrates that, in one embodiment, selecting may include testing a subset of the fixed logic circuits. In various embodiments, the testing may include testing an integrated circuit or other device after manufacture but before full production; although, it is understood that the above is merely an illustrative example to which the disclosed subject matter is not limited. In some embodiments, a subset of the plurality of fixed logic circuits 404 of FIG. 4 may be tested, as described above.

Block 1010 illustrates that, in one embodiment, selecting may include determining if any of the subset of fixed logic circuits produces an undesirable result. In various embodiments, the undesirable result may occur because the fixed logic circuit was incorrectly designed; although, it is understood that the above is merely an illustrative example to which the disclosed subject matter is not limited. In some embodiments, a subset of the plurality of fixed logic circuits 404 of FIG. 4 may produce an undesirable result, as described above.

Block 1012 illustrates that, in one embodiment, selecting may include selecting, from the subset of fixed logic circuits that produces an undesirable result, the subset of fixed logic circuits (FLCs) to be functionally replaced. In various embodiments, the selection criteria may be based upon, for example, which fixed logic circuits have been configured to be replaced, the expected extent of changes to the combinational logic design, the availability of the programmable logic core, etc.; although, it is understood that the above are merely a few illustrative examples to which the disclosed subject matter is not limited. In some embodiments, a subset of the plurality of fixed logic circuits 404 of FIG. 4 may be selected, as described above.

Block 1014 illustrates that, in one embodiment, a portion of the programmable logic core (PLC) may be configured to produce at least one output signal by performing a logic operation using a plurality of inputs received by the PLC. In one embodiment, the portion of the PLC may be configured to functionally replace the selected FLCs. In various embodiments, the portion of the PLC may be configured to replace stages in a pipelined architecture, as described above. In some embodiments, the programmable logic core 402 of FIG. 4 may be configured as described above.

Block 1016 illustrates that, in one embodiment, configuring may include dynamically configuring a plurality of programmable logic devices, included within the PLC, to perform the logic operation. In one embodiment, the dynamic configuration may include the use of a product term based architecture (e.g., an Altera™ FPGA), as described above; although, it is understood that the above is merely an illustrative example to which the disclosed subject matter is not limited. In some embodiments, the programmable logic core 402 of FIG. 4 may be configured as described above.

Block 1018 illustrates that, in one embodiment, configuring may include dynamically configuring a look-up table, included within the PLC, to perform the logic operation. In one embodiment, the dynamic configuration may include the use of a look-up table architecture (e.g., a Xilinx™ FPGA), as described above; although, it is understood that the above is merely an illustrative example to which the disclosed subject matter is not limited. In some embodiments, the programmable logic core 402 of FIG. 4 may be configured as described above.

Block 1050 illustrates that, in one embodiment, the input signals of the selected subset of FLCs may be dynamically routed to at least a portion of the inputs to the PLC. In one embodiment, the routing may involve the use of a permutation network of switches. In another embodiment, the routing may depend upon the portion of the PLC used to functionally replace the selected FLC(s). In some embodiments, the permutation of network switches 408 of FIG. 4 may dynamically route the input signals, as described above.

Block 1052 illustrates that, in one embodiment, routing the input signals may include using an input permutation network of switches. In such an embodiment, the input permutation network of switches may include a first number of inputs to the input permutation network of switches, and a second number of outputs to the input permutation network of switches. It is contemplated that, in one embodiment, the first number may be a relatively large number and the second number may be a relatively small number, as described above. In some embodiments, the input permutation of network switches 409 of FIG. 4 or the permutation of network switches 700 of FIG. 7 may dynamically route the input signals, as described above.

Block 1054 illustrates that, in one embodiment, routing the input signals may include configuring the input permutation network of switches to map each of a portion of the first number of inputs to one of the second number of outputs. In some embodiments, the input permutation of network switches 409 of FIG. 4 or the permutation of network switches 700 of FIG. 7 may configured to route the input signals, as described above.

Block 1056 illustrates that, in one embodiment, the input signals of the selected FLCs may be coupled with at least a portion of the first number of inputs to the input permutation network of switches. Block 1058 illustrates that, in one embodiment, at least a portion of the second number of outputs to the input permutation network of switches may be coupled with at least a portion of the inputs received by the PLC. In such an embodiment, the input permutation network of switches may facilitate the replacement of the selected FLCs. In some embodiments, the input permutation of network switches 409 of FIG. 4 or the permutation of network switches 700 of FIG. 7 may configured to route the input signals, as described above.

Block 1060 illustrates that, in one embodiment, routing the input signals may include using a wide network stage to map the inputs from the selected FLCs to a plurality of a first number of outputs of the wide network stage, wherein there are a first number of inputs from the selected FLCs. In such an embodiment, the wide network stage 602 of FIG. 6 may map the inputs, as described above.

Block 1062 illustrates that, in one embodiment, routing the input signals may include using a joint network stage to map each of a second number of outputs of the joint network stage to a plurality of the first number of outputs of the wide network stage. In various embodiments, the first number of outputs may be relatively large; whereas, the second number of outputs may be relatively small. In such an embodiment, the joint network stage 604 of FIG. 6 may map the outputs, as described above.

Block 1064 illustrates that, in one embodiment, routing the input signals may include using a narrow network stage to map each of the second number of outputs of the joint network stage to a plurality of a second number of inputs to the PLC. In such an embodiment, the narrow network stage 606 of FIG. 6 may map the outputs, as described above.

Block 1066 illustrates that, in one embodiment, routing the input signals may include using an input portion of a half-duplex bi-directional permutation network of switches. In various embodiments, the input portion of the half-duplex bi-directional permutation network of switches may be dynamically configurable. In such an embodiment, the input portion 810 of the half-duplex bi-directional permutation network of switches 800 of FIG. 8 may be used to routing the input signals, as described above.

Block 1068 illustrates that, in one embodiment, at least a portion of the output signals from the PLC may be dynamically routed to function as the output signals of the selected subset of FLCs. In one embodiment, the routing may involve the use of a permutation network of switches. In another embodiment, the routing may depend upon the portion of the PLC used to functionally replace the selected FLC(s). In yet another embodiment, the routing may use a multiplexer to select between the output signal produced by the PLC and the output signal produced by the combinational logic of the selected FLC, as described above. In some embodiments, the permutation of network switches 408 of FIG. 4 may dynamically route the output signals, as described above.

Block 1070 illustrates that, in one embodiment, routing the output signals may include using an output permutation network of switches. In such an embodiment, the output permutation network of switches may include a third number of inputs to the output permutation network of switches, and a fourth number of outputs to the output permutation network of switches. It is contemplated that, in one embodiment, the fourth number may be a relatively large number and the third number may be a relatively small number, as described above. In some embodiments, the output permutation of network switches 410 of FIG. 4 or the permutation of network switches 700 of FIG. 7 may dynamically route the output signals, as described above.

Block 1072 illustrates that, in one embodiment, routing the output signals may include configuring the output permutation network of switches to map each of a portion of the third number of inputs to one of the fourth number of outputs. In some embodiments, the output permutation of network switches 410 of FIG. 4 or the permutation of network switches 700 of FIG. 7 may be configured to route the output signals, as described above.

Block 1074 illustrates that, in one embodiment, the output signals of the PLC may be coupled with at least a portion of the third number of inputs to the output permutation network of switches. Block 1076 illustrates that, in one embodiment, at least a portion of the fourth number of outputs to the output permutation network of switches may be coupled with at least a portion of the outputs of the FLCs. In such an embodiment, the output permutation network of switches may facilitate the replacement of the selected FLCs. In some embodiments, the output permutation of network switches 410 of FIG. 4 or the permutation of network switches 700 of FIG. 7 may be configured to route the output signals, as described above.

Block 1078 illustrates that, in one embodiment, routing the output signals may include using an output portion of a half-duplex bi-directional permutation network of switches. In various embodiments, the output portion of the half-duplex bi-directional permutation network of switches may be dynamically configurable. In such an embodiment, the output portion 808 of the half-duplex bi-directional permutation network of switches 800 of FIG. 8 may be used for routing the output signals, as described above.

Implementations of the various techniques described herein may be implemented in digital electronic circuitry, or in computer hardware, firmware, software, or in combinations of them. Implementations may implemented as a computer program product, e.g., a computer program tangibly embodied in an information carrier, e.g., in a machine-readable storage device or in a propagated signal, for execution by, or to control the operation of, data processing apparatus, e.g., a programmable processor, a computer, or multiple computers. A computer program, such as the computer program(s) described above, can be written in any form of programming language, including compiled or interpreted languages, and can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory may be supplemented by, or incorporated in special purpose logic circuitry.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments.

What is claimed is:

1. An apparatus comprising:
a plurality of fixed logic circuits,
wherein at least a portion of the plurality of fixed logic circuits includes stages in a processing pipeline,
wherein each of the plurality of fixed logic circuits is configured to receive a plurality of input signals, perform combinational logic operations using the input signals, and produce at least one output signal,
wherein a first (1st) number of input signals are selectable as input signals to a programmable logic core and a second (2nd) number of output signals are selectable to be produced by the programmable logic core instead of the combinational logic operations, and
wherein the combinational logic operations are substantially fixed;
the programmable logic core
configured to receive a plurality of input signals, perform logic operations on the input signals, and produce at least one output signal, and
wherein the logic operations are dynamically configurable; and
a permutation network of switches configured to:
dynamically route a selected subset of the first (1st) number of input signals of the plurality of fixed logic circuits as at least a portion of the inputs signals of the programmable logic core,
dynamically route at least a portion of the output signals of the programmable logic core as a selected subset second (2nd) number of output signals of the plurality of fixed logic circuits;
wherein the permutation network of switches includes:
an input permutation network of switches including:
a first (1st) number of inputs; and,
a third (3rd) number of outputs;
wherein the input permutation network of switches is configured to map of each of a portion of the first (1st) number of inputs to one of the third (3rd) number of outputs; and
an output permutation network of switches including:
a fourth (4th) number of inputs; and
a second (2nd) number of outputs;
wherein the output permutation network of switches is configured to map of each of the second (2nd) number of outputs to one of a subset of the fourth (4th) number of inputs.

2. An apparatus comprising:
a plurality of fixed logic circuits,
wherein at least a portion of the plurality of fixed logic circuits includes stages in a processing pipeline,
wherein each of the plurality of fixed logic circuits is configured to receive a plurality of input signals, perform combinational logic operations using the input signals, and produce at least one output signal,
wherein a first (1st) number of input signals are selectable as input signals to a programmable logic core and a second (2nd) number of output signals are selectable to be produced by the programmable logic core instead of the combinational logic operations, and
wherein the combinational logic operations are substantially fixed;
the programmable logic core
configured to receive a plurality of input signals, perform logic operations on the input signals, and produce at least one output signal, and
wherein the logic operations are dynamically configurable; and
a permutation network of switches configured to:
dynamically route a selected subset of the first (1st) number of input signals of the plurality of fixed logic circuits as at least a portion of the inputs signals of the programmable logic core,
dynamically route at least a portion of the output signals of the programmable logic core as a selected subset second (2nd) number of output signals of the plurality of fixed logic circuits;
wherein the permutation network of switches includes:
a wide network stage including a first (1st) number of inputs and a first (1st) number of outputs, the wide network stage being configured to map each of the inputs to a plurality of the outputs;
a joint network stage including a first (1st) number of inputs and a third (3rd) number of outputs, the joint network stage being configured to map each output to a plurality of inputs;
a narrow network stage including a third (3rd) number of inputs and a third (3rd) number of outputs, the narrow network stage being configured to map each of the inputs to a plurality of the outputs; and
wherein the permutation network of switches is configured to map of each of a portion of the first (1st) number of inputs to one of the third (3rd) number of outputs.

3. An apparatus comprising:
a plurality of fixed logic circuits,
wherein at least a portion of the plurality of fixed logic circuits includes stases in a processing pipeline,
wherein each of the plurality of fixed logic circuits is configured to receive a plurality of input signals, perform combinational logic operations using the input signals, and produce at least one output signal,
wherein a first (1st) number of input signals are selectable as input signals to a programmable logic core and a second (2nd) number of output signals are selectable to be produced by the programmable logic core instead of the combinational logic operations, and
wherein the combinational logic operations are substantially fixed;
the programmable logic core
configured to receive a plurality of input signals, perform logic operations on the input signals, and produce at least one output signal, and
wherein the logic operations are dynamically configurable; and
a permutation network of switches configured to:
dynamically route a selected subset of the first (1st) number of input signals of the plurality of fixed logic circuits as at least a portion of the inputs signals of the programmable logic core,
dynamically route at least a portion of the output signals of the programmable logic core as a selected subset second (2nd) number of output signals of the plurality of fixed logic circuits;
wherein the permutation network of switches includes a half-duplex bi-directional permutation network of switches.

4. A method comprising:
selecting a subset of fixed logic circuits (FLCs) to be functionally replaced by a portion of a programmable logic core (PLC),
wherein at least a portion of the plurality of fixed logic circuits includes stages in a processing pipeline,
wherein each of the fixed logic circuits is configured to receive a plurality of input signals, perform combinational logic operations using the input signals, and produce at least one output signal, and wherein the combinational logic operations are substantially fixed;
configuring the portion of the programmable logic core (PLC) to produce at least one output signal by performing a logic operation using a plurality of inputs received by the PLC;
dynamically routine the input signals of the selected subset of FLCs to at least a portion of the inputs of the PLC; and
    dynamically routine at least a portion of the output signal(s) of the PLC to function as the output signals of the selected subset of FLCs;
wherein dynamically routing the input signals includes:
using an input permutation network of switches including:
    a first (1st) number of inputs; and
    a second (2nd) number of outputs; and
configuring the input permutation network of switches to map each of a portion of the first (1st) number of inputs to one of the second (2nd) number of outputs,
wherein the input signals of the selected FLCs are coupled with at least a portion of the first (1st) number of inputs; and
wherein at least a portion of the second (2nd) number of outputs are coupled with at least a portion of the inputs received by the PLC.

5. A method comprising:
selecting a subset of fixed logic circuits (FLCs) to be functionally replaced by a portion of a programmable logic core (PLC),
    wherein at least a portion of the plurality of fixed logic circuits includes stases in a processing pipeline,
    wherein each of the fixed logic circuits is configured to receive a plurality of input signals, perform combinational logic operations using the input signals, and produce at least one output signal, and
    wherein the combinational logic operations are substantially fixed;
configuring the portion of the programmable logic core (PLC) to produce at least one output signal by performing a logic operation using a plurality of inputs received by the PLC;
dynamically routine the input signals of the selected subset of FLCs to at least a portion of the inputs of the PLC; and
    dynamically routine at least a portion of the output signal(s) of the PLC to function as the output signals of the selected subset of FLCs;
wherein dynamically routing the output signals includes:
using an output permutation network of switches including:
    a third (3rd) number of inputs; and
    a fourth (4th) number of outputs; and
configuring the output permutation network of switches to map of each of the third (3rd) number of inputs to one of a portion of the fourth (4th) number of outputs;
wherein the output signals of the PLC are coupled with at least a portion of the third (3rd) number of inputs; and
wherein the fourth (4th) number of outputs are coupled with at least a portion of the outputs of the FLCs.

6. A method comprising:
selecting a subset of fixed logic circuits (FLCs) to be functionally replaced by a portion of a programmable logic core (PLC),
    wherein at least a portion of the plurality of fixed logic circuits includes stases in a processing pipeline,
    wherein each of the fixed logic circuits is configured to receive a plurality of input signals, perform combinational logic operations using the input signals, and produce at least one output signal, and
    wherein the combinational logic operations are substantially fixed;
configuring the portion of the programmable logic core (PLC) to produce at least one output signal by performing a logic operation using a plurality of inputs received by the PLC;
dynamically routine the input signals of the selected subset of FLCs to at least a portion of the inputs of the PLC; and
    dynamically routine at least a portion of the output signal(s) of the PLC to function as the output signals of the selected subset of FLCs;
wherein dynamically routing the input signals includes
    using a wide network stage to map the inputs from the selected FLCs, being a first (1st) number of inputs, to a plurality of a first (1st) number of outputs of the wide network stage;
    using a joint network stage to map each of a second (2nd) number of outputs of the joint network stage to a plurality of the first (1st) number of outputs of the wide network stage; and
    using a narrow network stage to map each of the second (2nd) number of outputs of the joint network stage to a at least two of a second (2nd) number of inputs to the PLC.

7. A method comprising:
selecting a subset of fixed logic circuits (FLCs) to be functionally replaced by a portion of a programmable logic core (PLC),
    wherein at least a portion of the plurality of fixed logic circuits includes stages in a processing pipeline,
    wherein each of the fixed logic circuits is configured to receive a plurality of input signals, perform combinational logic operations using the input signals, and produce at least one output signal, and
    wherein the combinational logic operations are substantially fixed;
configuring the portion of the programmable logic core (PLC) to produce at least one output signal by performing a logic operation using a plurality of inputs received by the PLC;
dynamically routing the input signals of the selected subset of FLCs to at least a portion of the inputs of the PLC; and
    dynamically routing at least a portion of the output signal(s) of the PLC to function as the output signals of the selected subset of FLCs;
wherein dynamically routing the input signals includes routing the input signals using an input portion of a half-duplex bi-directional permutation network of switches; and
wherein dynamically routing the output signals includes routing the output signals using an output portion of the half-duplex bi-directional permutation network of switches.

* * * * *

UNITED STATES PATENT AND TRADEMARK OFFICE
CERTIFICATE OF CORRECTION

PATENT NO.         : 7,696,782 B2                                            Page 1 of 1
APPLICATION NO. : 12/032193
DATED              : April 13, 2010
INVENTOR(S)        : Michael Liu It is certified that error appears in the above-identified patent and that said Letters Patent is hereby corrected as shown below:

In column 16, line 29, in claim 3, delete "stases" and insert -- stages --, therefor.

In column 17, line 7, in claim 4, delete "routine" and insert -- routing --, therefor.

In column 17, line 9, in claim 4, delete "routine" and insert -- routing --, therefor.

In column 17, line 29, in claim 5, delete "stases" and insert -- stages --, therefor.

In column 17, line 40, in claim 5, delete "routine" and insert -- routing --, therefor.

In column 17, line 42, in claim 5, delete "routine" and insert -- routing --, therefor.

In column 18, line 2, in claim 6, delete "stases" and insert -- stages --, therefor.

In column 18, line 13, in claim 6, delete "routine" and insert -- routing --, therefor.

In column 18, line 15, in claim 6, delete "routine" and insert -- routing --, therefor.

Signed and Sealed this

Thirtieth Day of November, 2010

David J. Kappos
*Director of the United States Patent and Trademark Office*